US009219088B2

(12) United States Patent
Wu

(10) Patent No.: US 9,219,088 B2
(45) Date of Patent: Dec. 22, 2015

(54) ARRAY SUBSTRATE, MANUFACTURING METHOD THEREOF, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Song Wu, Beijing (CN)

(73) Assignees: BOE TECHNOLOGY GROUP Co., Ltd, Beijing (CN); HEFEI XINSHENG OPTOELECTRONICS TECHNOLOGY Co., Ltd, Beijing (CN)

( * ) Notice: Subject to any disclaimer, the term of this patent is extended or adjusted under 35 U.S.C. 154(b) by 0 days.

(21) Appl. No.: 13/995,926

(22) PCT Filed: Nov. 6, 2012

(86) PCT No.: PCT/CN2012/084170
§ 371 (c)(1),
(2) Date: Jun. 19, 2013

(87) PCT Pub. No.: WO2013/189144
PCT Pub. Date: Dec. 27, 2013

(65) Prior Publication Data
US 2015/0014692 A1  Jan. 15, 2015

(30) Foreign Application Priority Data
Jun. 18, 2012 (CN) .......................... 2012 1 0207796

(51) Int. Cl.
H01L 27/12    (2006.01)
H01L 27/144   (2006.01)
G02F 1/1345   (2006.01)
G02F 1/1362   (2006.01)
G02F 1/1368   (2006.01)

(52) U.S. Cl.
CPC .......... H01L 27/1288 (2013.01); G02F 1/1368 (2013.01); G02F 1/13458 (2013.01);
(Continued)

(58) Field of Classification Search
CPC .......................... H01L 27/144; H01L 27/1214
USPC ................................................. 438/30; 257/72
See application file for complete search history.

(56) References Cited

U.S. PATENT DOCUMENTS 7,851,806 B2 * 12/2010 Long et al. .................... 257/72
2006/0145157 A1 * 7/2006 Choi et al. ..................... 257/66
(Continued)

FOREIGN PATENT DOCUMENTS

CN    1917743 A    2/2007
CN    101093844 A   12/2007
CN    101567380 A   10/2009

OTHER PUBLICATIONS

International Preliminary Report on Patentability, for PCT application No. PCT/CN2012/084170, dated Dec. 23, 2014—8 pgs.
(Continued)

Primary Examiner — Lex Malsawma
Assistant Examiner — Xia L Cross

(57) ABSTRACT

Embodiments of the present invention provide an array substrate, a manufacturing method thereof, and a display device. The array substrate comprises: a pixel region, a data-line pad region and a gate-line pad region; the pixel region comprises: a pixel electrode, a gate electrode of a TFT, source and drain electrodes of the TFT, a connection electrode, and a common electrode; the data-line pad region comprises: an insulating layer, a semiconductor layer, a data line, and a data-line connection pad; the data line and the source and drain electrodes are of a same layer and a same material; and the gate-line pad region comprises: a gate line, an insulating layer, and a gate-line connection pad; the gate line and the gate electrode are of a same layer and a same material; and the gate-line connection pad and the source and drain electrodes are of a same layer and a same material. The array substrate can reduce the number of masks and exposure times, thereby reducing manufacturing costs and improving production efficiency.

7 Claims, 5 Drawing Sheets

(52) U.S. Cl.
CPC ........ G02F1/136286 (2013.01); H01L 27/124 (2013.01); H01L 27/1214 (2013.01); H01L 27/144 (2013.01)

(56) References Cited

U.S. PATENT DOCUMENTS

| | | |
|---|---|---|
| 2007/0042585 A1 | 2/2007 | Sakai et al. |
| 2007/0247556 A1* | 10/2007 | Jang et al. ........................ 349/38 |
| 2009/0051839 A1* | 2/2009 | Lin et al. ......................... 349/38 |
| 2009/0206346 A1 | 8/2009 | Long et al. |
| 2009/0267074 A1 | 10/2009 | Kwon et al. |
| 2010/0012938 A1 | 1/2010 | Chang et al. |

OTHER PUBLICATIONS

International Search Report (Chinese language), for PCT application No. PCT/CN2012/084170—11 pgs.
English abstract of CN1917743A (cited above).
English abstract of CN101567380A (cited above).
First Office Action (Chinese language) from the State Intellectual Property Office ("SIPO") of the People's Republic of China in corresponding priority Chinese application No. CN 201210207796.9, issued on Jun. 2, 2015; 5 pages.
English translation of the First Office Action from SIPO in corresponding priority Chinese application No. CN 201210207796.9, issued on Jun. 2, 2015; 2 pages.
Second Office Action (Chinese language) from the State Intellectual Property Office of the People's Republic of China, in Chinese application No. CN 201210207796.9, issued on Sep. 18, 2015; 5 pages.
English translation of Second Office Action from the State Intellectual Property Office of the People's Republic of China, in Chinese application No. CN 201210207796.9, issued on Sep. 18, 2015; 2 pages.
English abstract of CN101093844A, dated Dec. 26, 2007 (cited above); 1 page.

* cited by examiner

ARRAY SUBSTRATE, MANUFACTURING METHOD THEREOF, AND DISPLAY DEVICE

CROSS REFERENCE TO RELATED APPLICATIONS

This application is based on International Application No. PCT/CN2012/084170 filed on Nov. 6, 2012, which claims priority to Chinese National Application No. 201210207796.9 filed on Jun. 18, 2012, the contents of which are incorporated herein by reference.

TECHNICAL FIELD

Embodiments of the present invention relate to an array substrate, a manufacturing method thereof, and a display device comprising the array substrate.

BACKGROUND

Display technology in recent years has undergone fast development; flat-panel displays are significantly distinguished from traditional displays for completely different display mode and manufacturing technologies. Flat-panel displays have features of being flat, light, thin and power-saving and are in compliance with the inexorable development trend of image displays in the future. So far, flat panel displays mainly include: thin-film transistor liquid crystal displays (TFT-LCDs), plasma display panels (PDP), and organic light-emitting diode displays, etc.

A thin-film transistor liquid crystal display (TFT-LCD) has features of small size, low power consumption and no radiation, etc, which has been developed rapidly in recent years and occupies a leading position in the current flat-panel display market. At present, TFT-LCDs have been applied widely in various products of large, medium and small sizes, covering almost all the popular electronic products in the present information society, such as high-definition digital TVs, (desktop and laptop) computers, mobile phones, PDAs, GPS, on-board displays, projectors, camcorders, digital cameras, electronic watches, calculators, electronic instruments, instrumentation, public displays, and virtual displays, etc., and surpass any other type of flat-panel display.

For a TFT-LCD, a TFT array substrate and a manufacturing process thereof determine its performance, yield, and product price. Because a masking process for patterning is complex and of high-cost, the number of masks (i.e., patterning times) to be used in a preparation process of a TFT array substrate has becomes an important factor to measure the complexity of the manufacturing process. Therefore, reducing the number of masks and exposure times in a manufacturing process of a TFT array substrate has become a key issue to improve the manufacturing process.

There are many methods to reduce the number of masks to be used in a preparation process. At present, the most commonly used are a Gray-Tone Mask (GTM) and a Half-Tone Mask (HTM). By utilizing these techniques, the number of masks and exposure times so far commonly used in a preparation process of a TFT array substrate, is four, that is, three ordinary masks plus one GTM or HTM. Although the number of masks and exposure times has been reduced to four, there are still disadvantages, for example inefficient productivity and equipment utilization, etc.

SUMMARY

In consideration of the problem in the prior art that relatively more times of masks are used during preparation of an array substrate, the embodiments of the present invention provide an array substrate, a manufacturing method thereof, and a display device comprising the array substrate.

First of all, an aspect of the present invention provides an array substrate, and the array substrate comprises: a pixel region, a data-line pad region and a gate-line pad region; the pixel region comprises: a pixel electrode, a gate electrode of a TFT, source and drain electrodes of the TFT, a connection electrode, and a common electrode; the pixel electrode is provided on an upper surface of the substrate; the gate electrode of the TFT and the connection electrode are of a same layer and a same material; a semiconductor layer is formed between the source, drain electrodes and the gate electrode; an insulating layer is formed between the semiconductor layer and the gate electrode; the pixel electrode is electrically connected with the drain electrode of the TFT via the connection electrode; the common electrode comprises a portion that is of a same layer and a same material as the source, drain electrodes, and the semiconductor layer and the insulating layer are sequentially formed between said portion that is of a same layer and a same material as the source, drain electrodes and the pixel electrode; the data-line pad region comprises a data line and a data-line connection pad; the data line and the source and drain electrodes are of a same layer and a same material; the gate-line pad region comprises a gate line and a gate-line connection pad; the gate line and the gate electrode are of a same layer and a same material; and the gate-line connection pad and the source and drain electrodes are of a same layer and a same material.

For example, the data-line pad region may further comprise an insulating layer and a semiconductor layer; the gate-line pad region further comprises an insulating layer.

For example, preferably, the array substrate may further comprise a passivation layer, which is formed in an uppermost layer of the pixel region, and in a portion of an uppermost layer of the data-line pad region except the data-line connection pad, and in a portion of an uppermost layer of the gate-line pad region except the gate-line connection pad.

For example, preferably, the array substrate may comprise at least one pixel region, and each pixel region comprises at least one TFT, with the TFT being provided at an edge of the pixel region.

Next, another aspect of the present invention provides a method of manufacturing an array substrate, and the method comprises steps as follows:

forming an array substrate as described above by using two times of multi-tone masking processes and two times of photoresist lifting-off treatments.

For example, preferably, the first-time multi-tone masking process and the first-time photoresist lifting-off treatment may be as follows:

on a substrate, a transparent thin-film layer and a gate metal layer are sequentially formed;

after formation of photoresist on the substrate, then first exposure is performed by a multi-tone masking process, and through development, the retained photoresist is divided into three levels of thickness;

in a region without the retained photoresist, the gate metal layer and the transparent thin-film layer are etched away;

the retained photoresist is subjected to first etching, so that the retained photoresist which currently has a thinnest thickness is removed, meanwhile, the retained photoresist in other regions is accordingly thinned;

in the region where the thinnest retained photoresist is removed, the corresponding gate metal layer is etched away;

the retained photoresist is subjected to second etching, so that the retained photoresist which currently has a thinnest thickness is removed, meanwhile, the retained photoresist in other regions is accordingly thinned;

on the substrate, an insulating layer and a semiconductor layer are sequentially formed;

by a photoresist lifting-off treatment, the currently remaining photoresist is lifted off, so that the insulating layer and the semiconductor layer deposited in the region of the remaining photoresist are also removed simultaneously; and a source-drain metal layer is formed.

For example, preferably, the second-time multi-tone masking process and the second-time photoresist lifting-off treatment are as follows:

photoresist is applied on the source-drain metal layer on the substrate, and second exposure is performed by a multi-tone masking process, and then through development, the retained photoresist is divided into three levels of thickness;

in a region without the retained photoresist, the source-drain metal layer and the semiconductor layer are etched away;

the retained photoresist is subjected to etching, so that the retained photoresist which currently has a thinnest thickness is removed, meanwhile, the retained photoresist in other regions is accordingly thinned;

in the region where the retained photoresist is removed, the source-drain metal layer and the semiconductor layer are etched away;

the retained photoresist is subjected to second etching, so that the retained photoresist which currently has a thinnest thickness is removed, meanwhile, the retained photoresist in other regions is accordingly thinned;

a passivation layer is formed; and by utilizing a photoresist lifting-off treatment, the remaining photoresist is lifted off, so that the passivation layer formed in the region of the remaining photoresist is also removed simultaneously, and thus a data-line connection pad in a data-line pad region and a gate-line connection pad in a gate-line pad region are exposed.

For example, preferably, after the first exposure and development, the three levels of thickness into which the retained photoresist is divided are: a thickest level, located in a gate-line region and at a site where a drain electrode of a TFT is electrically connected with a pixel electrode; a second-thickest level, located in a TFT gate region; and a thinnest level, located in a pixel-electrode region.

For example, preferably, after the second exposure and development, the three levels of thickness into which the retained photoresist is divided are: a thickest level, located in a data-line region and a gate-line region; a second-thickest level, located in a TFT source-drain region; and a thinnest level, located in a channel region between the TFT source and drain electrodes.

Further, still another aspect of the present invention provides a display device, comprising an array substrate as described above.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

REFERENCE NUMERALS

101 pixel region; 102 data-line pad region; 103 gate-line pad region; 104 TFT; 105 pixel electrode; 106 gate electrode of TFT; 107 source and drain electrodes of TFT; 108 first portion of common electrode; 109 second portion of common electrode; 110 third portion of common electrode; 111 connection electrode; 112 gate line; 113 gate-line connection pad; 114 data line; 201 glass substrate; 202 transparent thin-film layer; 203 gate metal layer; 204 insulating layer; 205 semiconductor layer; 206 source-drain metal layer; 207 passivation layer; 301, 302 photoresist.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, technical or scientific terminologies used herein should be interpreted in the usual sense as understood by those ordinary skilled in the relevant art of the present invention. The terms "first", "second", and the like, used in the specification and claims of this patent application of the invention, do not denote any order, quantity, or importance, but are used to distinguish among different integral parts. Similarly, the words "a", "an", "the" and the like, herein do not denote quantity limitation, but denote the presence of at least one of the referenced item. The terms "connect" or "connected" or the like, are not limited to physical or mechanical connections, but may comprise electrical connection, whether direct or indirect. "Upper", "lower", "left", "right" and the like, are only used to indicate a relative positional relationship, which may be correspondingly changed as an absolute position of a described object is changed.

The technical solution adopted by the embodiments of the present invention, can achieve the preparation of an array substrate by utilizing a multi-tone mask (MTM) and a photoresist lifting-off treatment, and can reduce the number of masks used in the preparation process, thereby achieving an effect of reduction in processing costs and improvement in productivity and equipment utilization.

Figure 1:
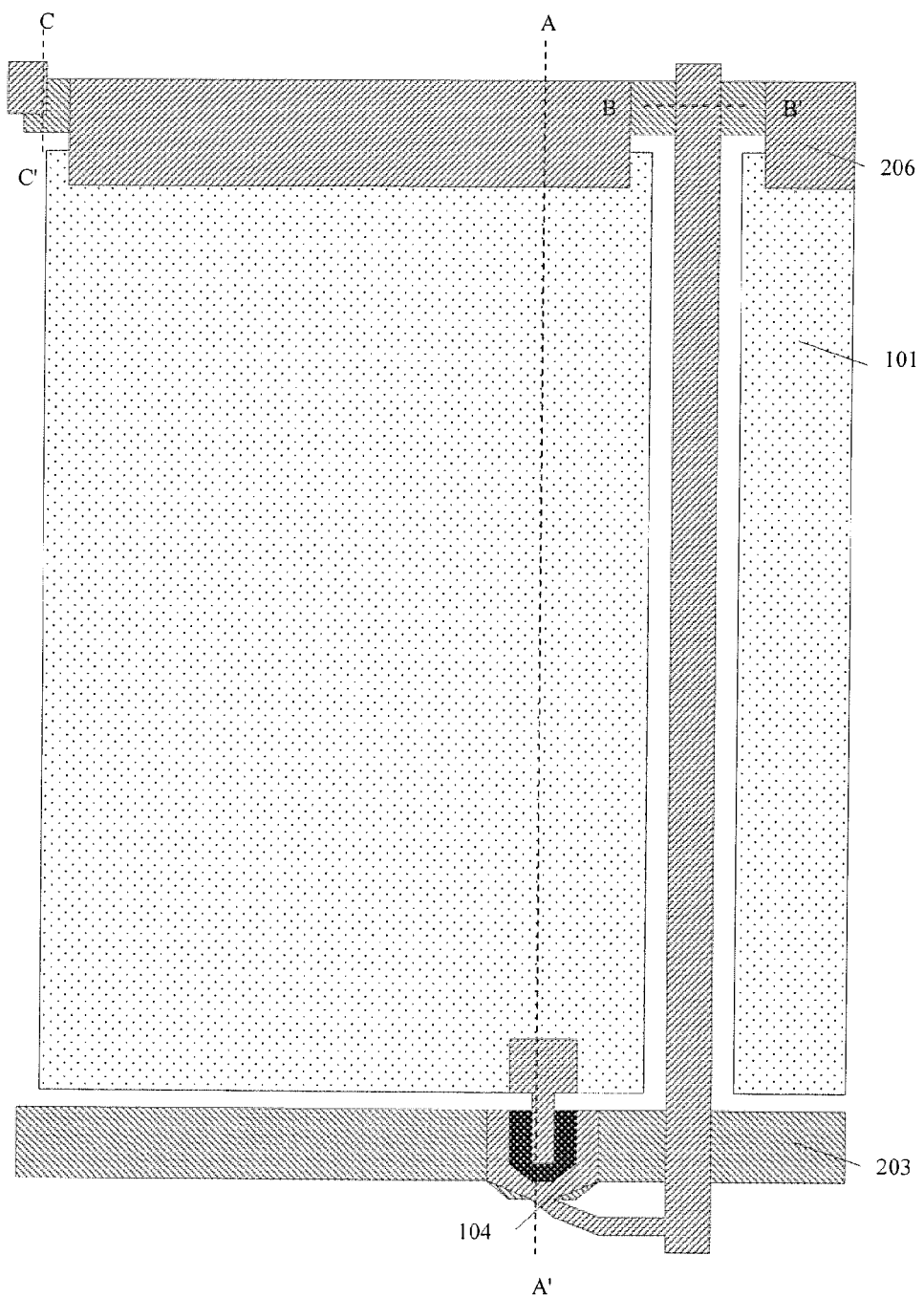
FIG. 1 is a schematic structural diagram showing a plan view of an array substrate of the present invention.

First of all, in the plan structure as shown in FIG. 1, an array substrate of the present invention, substantially the same as an existing array substrate, comprises: a plurality of gate lines, a plurality of data lines, and a plurality of pixel regions 101 arranged in an array; each pixel region 101 has at least one TFT 104 formed at an edge thereof. Each row of TFTs are controlled by a gate line, and each column of TFTs are provided with data signals through a data line; the gate lines and the data lines are connected to an external driver chip, respectively, via their respective connection pads. In the following description, it is mainly focused on a single pixel region; however, the other pixel regions can be formed in a similar way.

Figure 2:
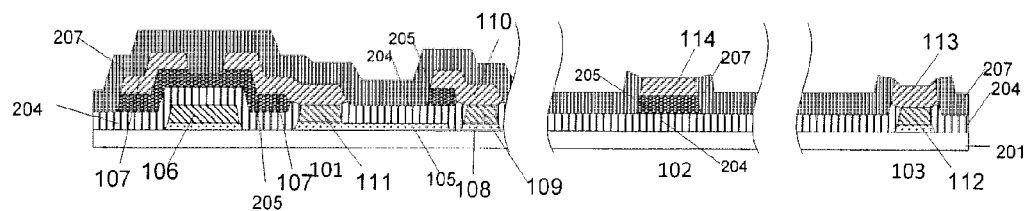
FIG. 2 is a schematic structural diagram showing a sectional-view of the array substrate of the present invention.

In the sectional structure as shown in FIG. 2, the array substrate in the embodiment of the present invention comprises: a pixel region 101 (taken along the direction A-A' in FIG. 1), a data-line pad region 102 (taken along the direction B-B' in FIG. 1), and a gate-line pad region 103 (taken along the direction C-C' in FIG. 1). The pixel region 101 comprises: a pixel electrode 105, a gate electrode 106 of a TFT, a source electrode 107 and a drain electrode 107 of the TFT, a connection electrode 111, and a common electrode.

The pixel electrode 105 is provided on the upper surface of a substrate 201; the gate electrode 106 of the TFT and the connection electrode 111 are provided in a same layer and formed of a same material (are of a same layer and a same material); a semiconductor layer 205 is formed between the source, drain electrodes 107 and the gate electrode 106; an insulating layer 204 is further formed between the semiconductor layer 205 and the gate electrode 106; the pixel electrode 105 is electrically connected with the drain electrode 107 of the TFT via the connection electrode 111; the common electrode comprises: a first portion 108 that is of a same layer and a same material as the pixel electrode 105, a second portion 109 that is of a same layer and a same material as the gate electrode 106 of the TFT and the connection electrode 111, and a third portion 110 that is of a same layer and a same material as the source, drain electrodes 107; the semiconductor layer 205 and the insulating layer 204 are sequentially formed between the third portion 110 and the pixel electrode 105, thus the portion where the common electrode overlaps with the pixel electrode 105 constitutes a storage capacitor of the TFT; in addition, below the gate electrode 106, there may be further provided a portion that is of a same layer and a same material as the pixel electrode 105. The data-line pad region 102 comprises: the insulating layer 204, the semiconductor layer 205, a data line 114, and a data-line connection pad (not shown); the data line 114 and the source and drain electrodes 107 are of a same layer and a same material. The gate-line pad region 103 comprises: a gate line 112, the insulating layer 204, and a gate-line connection pad 113; the gate line 112 and the gate electrode 106 are of a same layer and a same material; and the gate-line connection pad 113 and the source and drain electrodes 107 are of a same layer and a same material. The array substrate may further comprise a passivation layer 207, which is formed in an uppermost layer of the pixel region 101, and in a portion of an uppermost layer of the data-line pad region 102 except the data-line connection pad, and in a portion of an uppermost layer of the gate-line pad region 103 except the gate-line connection pad 113; in addition, below the gate line 112, there may be further provided a portion that is of a same layer and a same material as the pixel electrode 105.

The substrate 201 may be any kind of transparent substrate, such as a glass substrate, a quartz substrate, a plastic substrate, or the like; and in this embodiment, it is preferably a glass substrate.

It should be noted that, depending on the requirements of a practical design, below the gate electrode 106 in the pixel region 101, there may not provide a portion that is of a same layer and a same material as the pixel electrode 105; also, the common electrode may not comprise the first portion 108 and the second portion 109; below the gate line 112 in the gate-line pad region 103, there may be optionally provided a portion that is of a same layer and a same material as the pixel electrode 105.

Next, the method of preparing an array substrate having the above-described structure will be explained, with reference to relevant views showing results of implementation in the preparation process.

Figure 3:
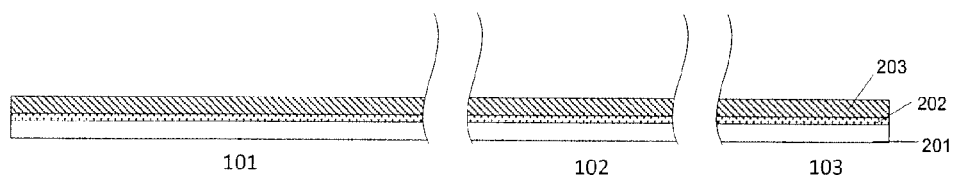
FIG. 3 is a schematic structural diagram showing a sectional-view after deposition of a transparent thin-film layer and a gate metal layer.

1. As shown in FIG. 3, on the glass substrate 201, a transparent conductive thin-film layer 202 and a gate metal layer 203 are sequentially formed, through for example a process of depositing, coating, screen printing, imprinting, or the like. The transparent conductive thin-film layer 202 is used to ultimately form the pixel electrode, and it also can optionally form: the first portion of the common electrode, the portion that is below the gate electrode and is of a same layer and a same material as the pixel electrode, and the portion that is below the gate line and is of a same layer and a same material as the pixel electrode. The gate metal layer 203 is used to ultimately form the gate electrode, the gate line, the second portion of the common electrode, and the connection electrode.

Figure 4:
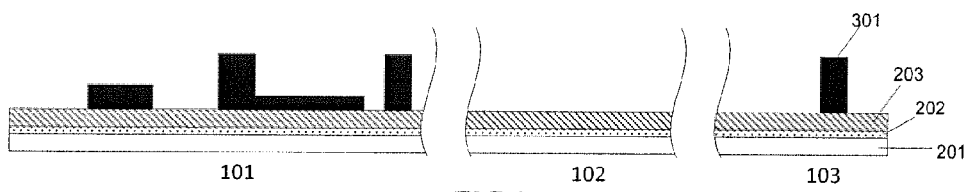
FIG. 4 is a schematic structural diagram showing a sectional-view after exposure with a first-time use of a MTM.

2. As shown in FIG. 4, on the substrate formed with the above-described thin films, after photoresist 301 is formed through for example a process of depositing, coating or the like, first exposure is performed by utilizing an MTM. The principle of a multi-tone mask (MTM) is similar to that of a GTM or a HTM, that is, materials of different light-transmittance are respectively employed to constitute different zones of a mask plate. As the light intensity transmitted through respective parts of the MTM is different, which causes the exposure intensity of the corresponding parts of the photoresist 301 to be different accordingly; through development upon the exposed photoresist, the retained photoresist 301 can be obtained, the shape of which is shown in FIG. 4. As shown in FIG. 4, the retained photoresist 301 can be divided into three levels of thickness: the thickest level, located in a gate-line region and at the site where the drain electrode of the TFT is electrically connected with the pixel electrode; the second-thickest level, located in a TFT gate region; and the thinnest level, located in a pixel-electrode region.

Figure 5:
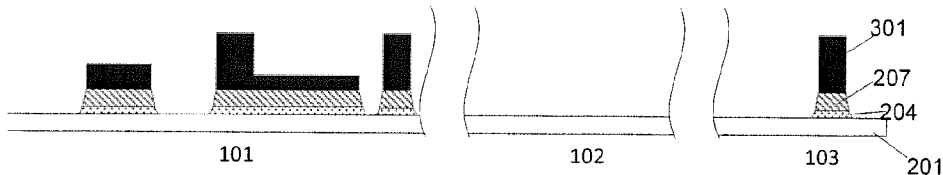
FIG. 5 is a schematic structural diagram showing a sectional-view after etching of the transparent thin-film layer and the gate metal layer.

3. As shown in FIG. 5, in the region without the retained photoresist 301, the gate metal layer 203 and the transparent thin-film layer 202 are etched away, and a resulting pattern is shown in FIG. 5.

Figure 6:
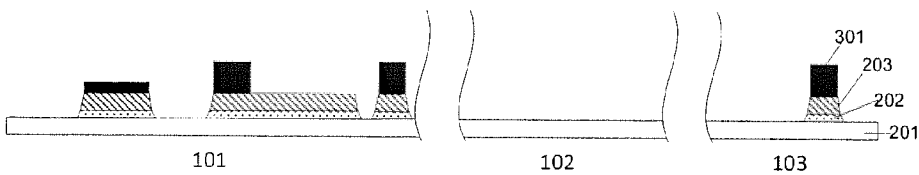
FIG. 6 is a schematic structural diagram showing a sectional-view after first etching of retained photoresist.

4. As shown in FIG. 6, the retained photoresist 301 is subjected to first etching, so that the retained photoresist 301 which currently has a thinnest thickness (i.e., in the pixel-electrode region) is removed, meanwhile, the retained photoresist 301 in other regions is accordingly thinned. For example, part of the photoresist is removed through an ashing process.

Figure 7:
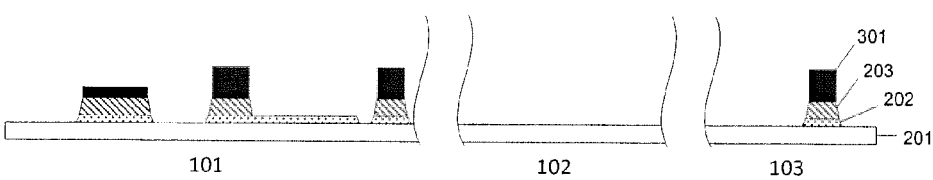
FIG. 7 is a schematic structural diagram showing a sectional-view after etching of the gate metal layer.

5. As shown in FIG. 7, in the pixel-electrode region where the photoresist 301 is removed after step 4, the gate metal layer 203 is etched. Now, a pixel-electrode pattern is obtained.

Figure 8A:
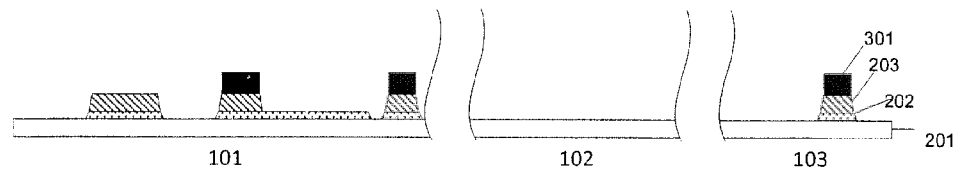
FIG. 8A is a schematic structural diagram showing a sectional-view after second etching of the retained photoresist.
Figure 8B:
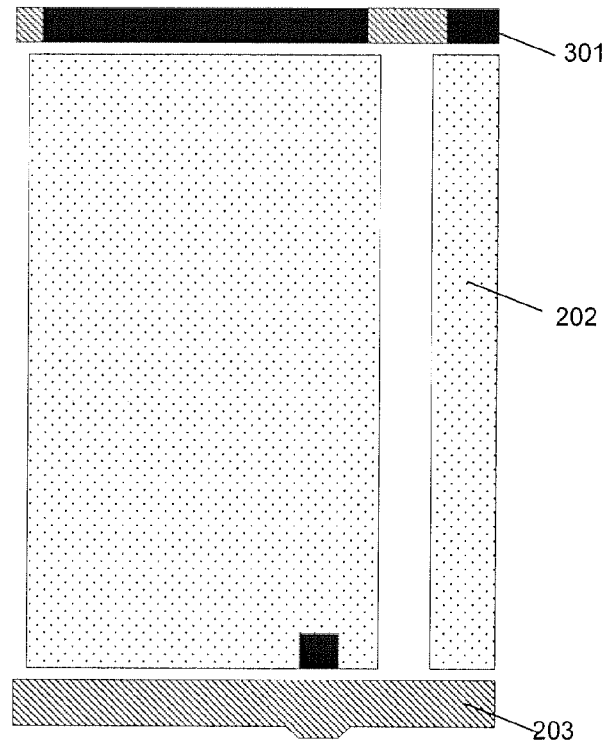
FIG. 8B is a schematic structural diagram showing a plan view after the second etching of the retained photoresist.

6. As shown in FIG. 8A, the retained photoresist 301 is subjected to second etching, so that the retained photoresist 301 which currently has a thinnest thickness (i.e., in the TFT gate region) is removed, meanwhile, the retained photoresist 301 in other regions is accordingly thinned. For example, part of the photoresist is removed through an ashing process. The plan view of the array substrate formed after this step is shown in FIG. 8B.

Figure 9:
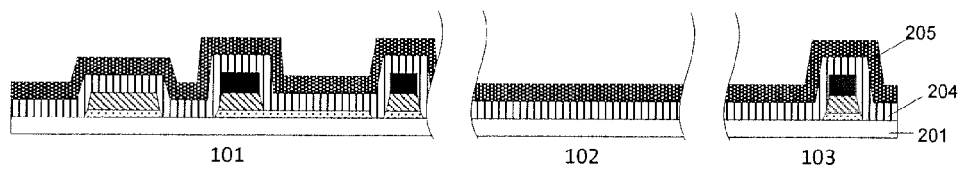
FIG. 9 is a schematic structural diagram showing a sectional-view after deposition of an insulating layer and a semiconductor layer.

7. As shown in FIG. 9, on the substrate formed after step 6, an insulating layer 204 and a semiconductor layer 205 are sequentially formed, through a process of depositing, coating, screen printing, imprinting, or the like.

Figure 10:
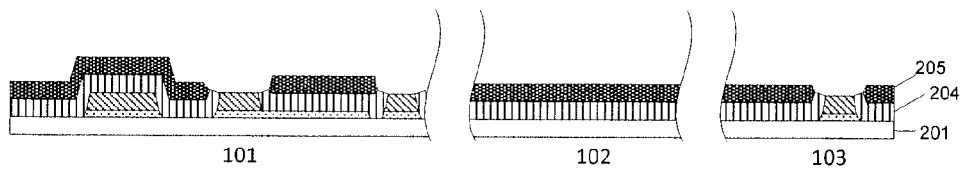
FIG. 10 is a schematic structural diagram showing a sectional-view after first-time lifting-off treatment.

8. As shown in FIG. 10, by utilizing an existing photoresist lifting-off process, the currently remaining photoresist 301 is lifted off, so that the insulating layer 204 and the semiconductor layer 205 deposited in the region of the remaining photoresist 301 are also removed simultaneously.

Figure 11:
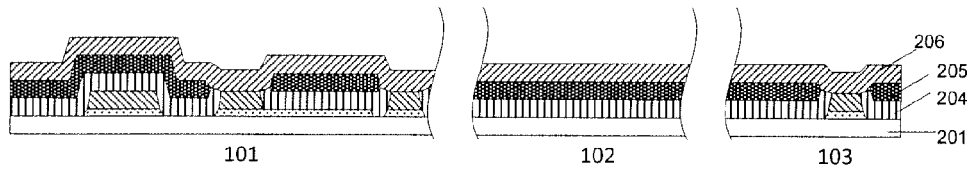
FIG. 11 is a schematic structural diagram showing a sectional-view after deposition of a source-drain metal layer.

9. As shown in FIG. 11, a source-drain metal layer 206 is formed, through a process of depositing, coating, screen printing, imprinting, or the like.

Figure 12:
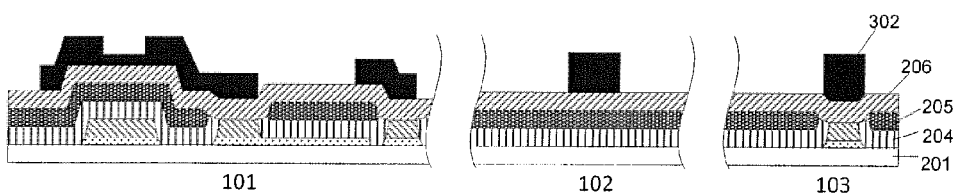
FIG. 12 is a schematic structural diagram showing a sectional-view after exposure with a second-time use of a MTM.

10. As shown in FIG. 12, on the substrate formed after step 9, photoresist 302 is formed through a process of depositing, coating or the like, and second exposure is performed by utilizing a MTM, and then through development, the retained photoresist with the shape as shown in FIG. 12 is obtained. As shown in FIG. 12, the retained photoresist 302 is divided into three levels of thickness: the thickest level, located in a data-line region and the gate-line region; the second-thickest level, located in a TFT source-drain region; and a thinnest level, located in a channel region between the source and drain electrodes of the TFT.

Figure 13:
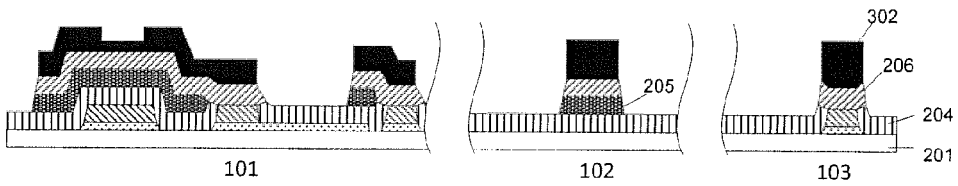
FIG. 13 is a schematic structural diagram showing a sectional-view after etching of the source-drain metal layer.

11. As shown in FIG. 13, in a region without the retained photoresist 302, the source-drain metal layer 206 and the semiconductor layer 205 are etched away, and a resulting pattern is shown in FIG. 13.

Figure 14:
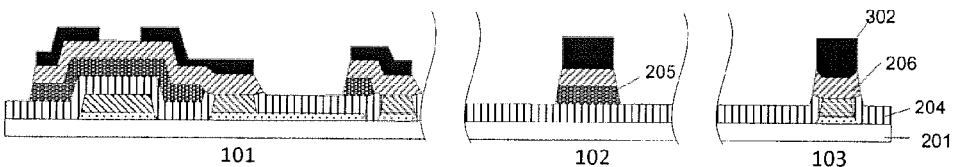
FIG. 14 is a schematic structural diagram showing a sectional-view after first etching of retained photoresist.

12. As shown in FIG. 14, the retained photoresist 302 is subjected to etching, so that the retained photoresist 302 which currently has a thinnest thickness (i.e., in the channel region between the TFT source and drain electrodes) is removed, meanwhile, the retained photoresist 302 in other regions is accordingly thinned. For example, part of the photoresist is removed through an ashing process.

Figure 15:
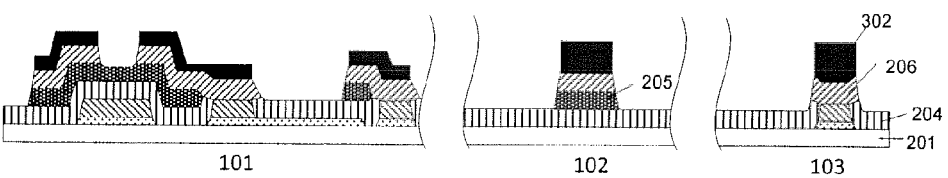
FIG. 15 is a schematic structural diagram showing a sectional-view after a channel is obtained by etching.

13. As shown in FIG. 15, in the channel region between the TFT source and drain where the retained photoresist 302 is removed after step 12, the source-drain metal layer 206 and the semiconductor layer 205 are etched away, and a channel pattern is obtained; here, the thin-film transistor (TFT) patterns are completed.

Figure 16:
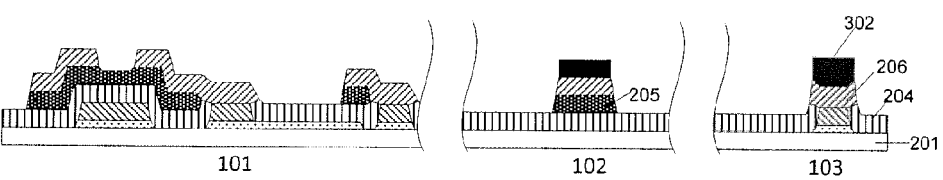
FIG. 16 is a schematic structural diagram showing a sectional-view after second etching of the retained photoresist.

14. As shown in FIG. 16, the retained photoresist 302 is subjected to second etching, so that the retained photoresist 302 in the TFT source-drain region which currently has a thinnest thickness is removed, meanwhile, the retained photoresist 302 in other regions is accordingly thinned. For example, part of the photoresist is removed through an ashing process.

Figure 17:
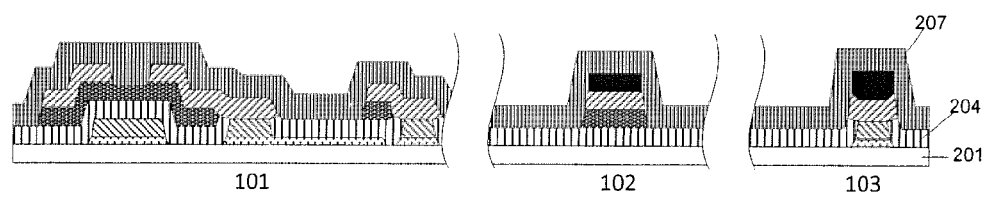
FIG. 17 is a schematic structural diagram showing a sectional-view after deposition of a passivation layer.

15. As shown in FIG. 17, a passivation layer 207, as a protective thin film, is formed through a process of depositing, coating, screen printing, imprinting, or the like.

16. By utilizing a photoresist lifting-off process, the remaining photoresist 302 is lifted off, so that the passivation layer 207 formed in the region of the remaining photoresist 302 is also removed simultaneously, and thus a data-line connection pad in the data-line pad region 102 and a gate-line connection pad in the gate-line pad region 103 are exposed; in this way, an array substrate with a sectional structure as shown in FIG. 2 is obtained.

It should be noted that, in the above processes, the etching process may be a wet-etching process (with an etching solution), or may be a dry-etching process (with etching gas), still or may be an etching process with plasma, or any combination of the above-mentioned etching processes.

Thus, in the embodiment of the present invention, a TFT array substrate as shown in FIG. 1 and FIG. 2 is accomplished, by utilizing MTM masking processes only two times. Compared with the prior art which requires at least four-time masking processes, the embodiment of the present invention can accomplish a TFT array substrate through only two-time masking processes, by utilizing the preparation process which combines a MTM and a photoresist lifting-off treatment; thus, two masking-and-exposure processes are reduced, and accordingly, the complexity and costs caused by masking-and-exposure processes are reduced by half, thereby reducing processing time period and processing costs and at the same time improving productivity and equipment utilization.

In addition, an embodiment of the present invention further provides a display device comprising an array substrate as described above, and the display device may be a liquid crystal panel, an OLED panel, a liquid crystal display, an OLED display, an electronic paper, and the like display device.

The above are merely exemplary implementations of the present invention, but not for limiting the scope of the invention; instead, the scope of the invention should be defined by the appended claims.

The invention claimed is:

1. An array substrate, comprising: a pixel region, a data-line pad region and a gate-line pad region;
  wherein the pixel region comprises: a pixel electrode, a gate electrode of a thin-film transistor (TFT), source and drain electrodes of the TFT, a connection electrode electrically connecting the pixel electrode with the drain electrode of the TFT, and a common electrode; the pixel electrode is provided on an upper surface of the substrate; the connection electrode is provided on an upper surface of the pixel electrode; the gate electrode of the TFT and the connection electrode are of a same layer and a same material; a semiconductor layer is formed between the source, drain electrodes and the gate electrode; an insulating layer is formed between the semiconductor layer and the gate electrode; the pixel electrode is electrically connected with the drain electrode of the TFT via the connection electrode; the common electrode comprises a portion that is of a same layer and a same material as the source, drain electrodes, moreover, the semiconductor layer and the insulating layer are sequentially formed between said portion that is of a same layer and a same material as the source, drain electrodes and the pixel electrode, wherein the portion where the common electrode overlaps with the pixel electrode constitutes a storage capacitor of the TFT;

the data-line pad region comprises a data line and a data-line connection pad; the data line and the source and drain electrodes are of a same layer and a same material; and the gate-line pad region comprises a gate line and a gate-line connection pad; the gate line and the gate electrode are of a same layer and a same material; and the gate-line connection pad and the source and drain electrodes are of a same layer and a same material.

2. The array substrate according to claim 1, further comprising: a passivation layer, which is formed in an uppermost layer of the pixel region, and in a portion of an uppermost layer of the data-line pad region except the data-line connection pad, and in a portion of an uppermost layer of the gate-line pad region except the gate-line connection pad.

3. A display device comprising an array substrate in accordance with claim 1.

4. A method of manufacturing an array substrate, comprising:

forming an array substrate by two times of multi-tone masking processes to form a retained photoresist with three levels of non-zero thickness and two times of photoresist lifting-off treatments, wherein a first-time multi-tone masking process and a first-time photoresist lifting-off treatment sequentially comprise:

on a substrate, sequentially forming a transparent thin-film layer and a gate metal layer;

forming photoresist on the substrate, then performing first exposure by the first-time multi-tone masking process, and through development, the retained photoresist being divided into three levels of non-zero thickness;

in a region without the retained photoresist, etching away the gate metal layer and the transparent thin-film layer;

first etching the retained photoresist so that the retained photoresist which currently has a thinnest thickness is removed, meanwhile, the retained photoresist in other regions is accordingly thinned;

in the region where the thinnest retained photoresist is removed, etching away the corresponding gate metal layer;

second etching the retained photoresist so that the retained photoresist which currently has a thinnest thickness is removed, meanwhile, the retained photoresist in other regions is accordingly thinned;

on the substrate, sequentially forming an insulating layer and a semiconductor layer;

by utilizing the first-time photoresist lifting-off treatment, lifting off the currently remaining photoresist, so that the insulating layer and the semiconductor layer deposited in the region of the remaining photoresist are also removed simultaneously; and forming a source-drain metal layer.

5. The method according to claim 4, wherein a second-time multi-tone masking process and a second-time photoresist lifting-off treatment sequentially comprise:

applying photoresist on the source-drain metal layer on the substrate, and performing second exposure by the second-time multi-tone masking process, and then through development, the retained photoresist being divided into three levels of non-zero thickness;

in a region without the retained photoresist, etching away the source-drain metal layer and the semiconductor layer;

etching the retained photoresist so that the retained photoresist which currently has a thinnest thickness is removed, meanwhile, the retained photoresist in other regions is accordingly thinned;

in the region where the retained photoresist is removed, etching away the source-drain metal layer and the semiconductor layer;

second etching the retained photoresist so that the retained photoresist which currently has a thinnest thickness is removed, meanwhile, the retained photoresist in other regions is accordingly thinned;

forming a passivation layer;

by utilizing the second-time photoresist lifting-off treatment, lifting off the remaining photoresist, so that the passivation layer formed in the region of the remaining photoresist is also removed simultaneously, and thus a data-line connection pad in a data-line pad region and a gate-line connection pad in a gate-line pad region are exposed.

6. The method according to claim 4, wherein after the first exposure and development, the three levels of non-zero thickness into which the retained photoresist is divided are: a thickest level, located in a gate-line region and at a site where a drain electrode of a TFT is electrically connected with a pixel electrode; a second-thickest level, located in a TFT gate region; and a thinnest level, located in a pixel-electrode region.

7. The method according to claim 5, wherein after the second exposure and development, the three levels of non-zero thickness into which the retained photoresist is divided are: a thickest level, located in a data-line region and a gate-line region; a second-thickest level, located in a TFT source-drain region; and a thinnest level, located in a channel region between the TFT source and drain electrodes.

* * * * *